US012620938B2

(12) United States Patent
Su et al.

(10) Patent No.: US 12,620,938 B2
(45) Date of Patent: May 5, 2026

(54) HIGH EFFICIENCY AMPLIFIER WITH OUTPUT SIGNAL BRACKETING DYNAMIC SUPPLIES

(71) Applicant: Avago Technologies International Sales Pte. Limited, Singapore (SG)

(72) Inventors: Feng Su, San Jose, CA (US); Tom W. Kwan, Cupertino, CA (US); Iuri Mehr, Irvine, CA (US); Fang Lin, Irvine, CA (US); Guo Wen Wei, Saratoga, CA (US); Kevin Yuhang Li, San Jose, CA (US); Yue Hu, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 486 days.

(21) Appl. No.: 18/360,433

(22) Filed: Jul. 27, 2023

(65) Prior Publication Data

US 2025/0038710 A1     Jan. 30, 2025

(51) Int. Cl.
| | |
|---|---|
| *H03F 1/02* | (2006.01) |
| *H03F 3/213* | (2006.01) |
| *H03K 17/30* | (2006.01) |

(52) U.S. Cl.
CPC ........... *H03F 1/0222* (2013.01); *H03F 3/213* (2013.01); *H03K 17/302* (2013.01)

(58) Field of Classification Search
CPC ...... H03F 1/0222; H03F 3/213; H03F 3/2173; H03K 17/302; H03K 3/011
USPC ......................................... 330/127, 297, 279
See application file for complete search history.

(56) References Cited

U.S. PATENT DOCUMENTS

2017/0201217 A1*   7/2017   Waller, Jr. ............... H03F 3/185

* cited by examiner

*Primary Examiner* — Hieu P Nguyen
(74) *Attorney, Agent, or Firm* — Foley & Lardner LLP

(57) ABSTRACT

A device including a first circuit, a second circuit. The first circuit to receive a first signal, a second signal, and a third signal, and the first circuit to provide a fourth signal and a fifth signal. The second circuit to receive the fourth signal and the fifth signal, and the second circuit to control a first set of components to maintain a difference between a first amount of power provided to a first terminal of a driver and a second amount of power provided to a second terminal of the driver or to control a second set of components to maintain the difference between the first amount of power provided to the first terminal of the driver and the second amount of power provided to the second terminal of the driver.

20 Claims, 12 Drawing Sheets

300

700

900

1100

1200

1205

Receive a first signal

1210

Receive a second signal

1215

Receive a third signal

1220

Provide a fourth signal

1225

Provide a fifth signal

1230

Receive the fourth signal and the fifth signal

1235

Determine whether to control sets of components

HIGH EFFICIENCY AMPLIFIER WITH OUTPUT SIGNAL BRACKETING DYNAMIC SUPPLIES

BACKGROUND

The present disclosure is related to amplification of signals and amplifiers. Amplifiers can have multiple classes and each class of amplifier can have different characteristics.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
FIG. 1 is a block diagram of a system for use in voltage bracketing, according to some embodiments.
Figure 1:
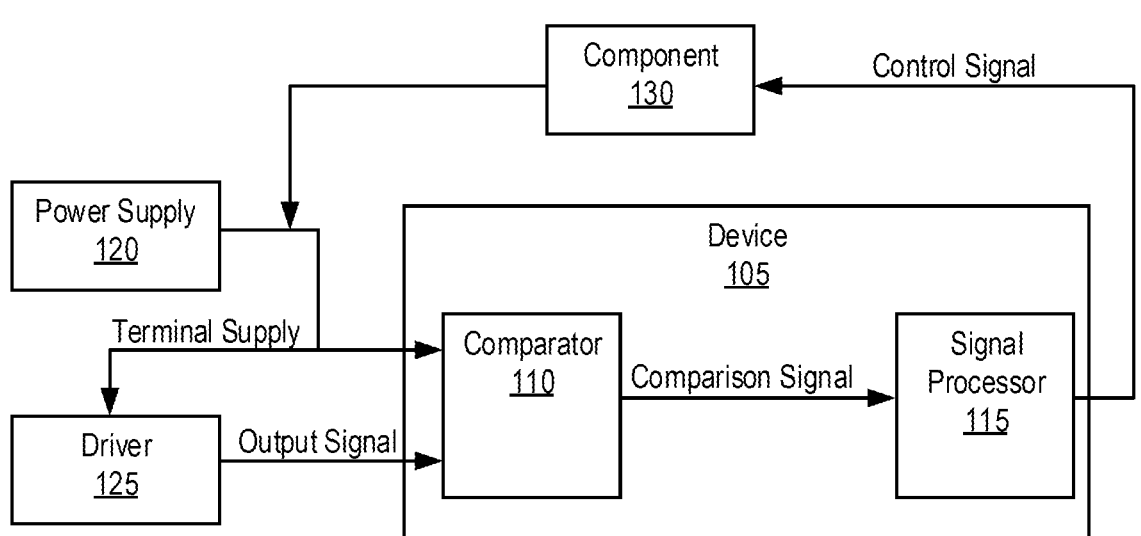

Some embodiments are related to systems and methods for voltage bracketing for amplifiers. Voltage bracketing may refer to and/or include maintaining a voltage bracket between terminals of an amplifier, envelope tracking to determine when to adjust amounts of power provided to the terminals of the amplifier, monitoring voltage swings to adjust the amounts of power provided to the amplifier, output signal tracking, power supply tracking, or power supply modification as well as combinations of these operations in some embodiments. A voltage bracket may refer to a voltage difference between a positive supply terminal and a negative supply terminal. A voltage stress may refer to a maximum voltage differential applied to the amplifier in some embodiments. Maintaining a voltage bracket (e.g., a constant voltage differential) may allow for the efficiency of the amplifier to be improved in some embodiments. For example, a system that provides a voltage bracket of 5 Volts (V) may be implemented in circuits that include voltage tolerances less than 5V. The smaller the tolerance of the amplifier may result in an increase in efficiency relative to a second amplifier having a larger tolerance (for example, a voltage tolerance of 10V). Output signal tracking refer to monitoring, analyzing, recording, and/or otherwise evaluating output signals of amplifiers in some embodiments. For example, output signal tracking may include receiving an output signal from an amplifier and comparing a value of the output signal with an amount of power provided to the amplifier. Tracking values of output signals provided by amplifiers may allow for the efficiency of the amplifier to be improved in some embodiments.

An amplifier is generally electrically coupled to a power supply and the power supply provides power to the amplifier. The power supply generally provides the power to the amplifier at a given voltage or current level (e.g., 0.7 volts, 1 volt, 5 volts, 10 volts, 12 volts, etc.). For example, an amount of power provided to a terminal of the amplifier may include a voltage level of 7V. The given voltage or current may be Direct Current (DC), Alternating Current (AC), and/or other varying combinations. The voltage level or current level provided to the amplifier can impact the efficiency of the amplifier. For example, the level of voltage provided to power supply terminals of the amplifier may establish an output range for the amplifier (e.g., the output of the amplifier may be unable to exceed the amount of power (e.g., voltage level) provided to the amplifier from the power supply). Additionally, characteristics of input signals may also impact the efficiency of the amplifier.

According to one example, an amplifier may receive a signal at a voltage level of 3 volts and receive power at its power terminals at a voltage level of 12 volts. The amplifier and/or a circuit including the amplifier may have a given gain factor which impacts the voltage level of the output signal provided by the amplifier. For example, the amplifier may have a gain factor of 2 meaning that the amplifier may be able to produce an output signal having a voltage level of 6 volts responsive to the amplifier receiving an input signal having a voltage level of 3 volts. In this example, the efficiency of the amplifier may be reduced because the amplifier receives power at the 12V level when it only produces output signals at a voltage level of 6V based on the input signal and the power level. An amplifier may refer to a circuit that provides an input signal and provides an output signal according to a gain in some embodiments. The gain can be any number including numbers above, below and equal to 1. An operational amplifier may refer to an amplifier with high gain and high input impedance in some embodiments. An operational amplifier can have inverting and non-inverting inputs and outputs for performing operations on an input voltage in some embodiments. Operational amplifiers generally operate according to a current rule where no current flow into the inverting and non-inverting inputs and a voltage rule where the output of the operational amplifier attempts to ensure that the voltage difference between the inverting and non-inverting inputs is zero in some embodiments.

Some technical solutions and advantages of some embodiments are related to a system including a device that can track levels of signals provided by an amplifier (e.g., a driver) and compare those levels of signals with levels of the power signals provided to the power supply terminals of the amplifier. The device can control and/or otherwise change the amount of power provided to the power supply terminals to maintain a voltage bracket for the amplifier. For example, the device can establish a voltage bracket of 5V by provided a signal having a voltage level of 5V to a positive terminal of the amplifier and by connecting a negative terminal of the amplifier to ground (e.g., 0V). In this example, the levels of signal provided by the amplifier may approach 5V (e.g., the signals having voltage levels around 5V) and the device can increase the voltage level provided to the positive terminal and the negative terminal of the amplifier. The device increasing the voltage levels may result in the voltage bracket of the amplifier being maintained. For example, the voltage level provided to the positive terminal may be increased from 5V to 10V and the voltage level provided to the negative terminal may be increased from 0V to 5V. In this example, the voltage bracket (e.g., the voltage difference between the positive terminal and the negative terminal) may still be 5V (e.g., the voltage bracket is maintained). Additionally, the device increasing the voltage level to the positive terminal of the amplifier may prevent clipping (e.g., the input signal cannot be amplified beyond a certain amount) of the signals provided by the amplifier. A terminal may refer to an input, output, an input/output for a circuit component (e.g., whether active or passive) in some embodiments.

The device can include at least one circuit. For example, the device can include a first circuit and a second circuit. The first circuit can receive signals corresponding to different amounts of power that can be provided to the amplifier by at least one source. For example, the different amounts of power can be provided by a first source and/or a second source. The first circuit can also receive signals provided by the amplifier. For example, the first circuit can receive signals corresponding to an output of the amplifier. The first circuit can produce signals that may indicate comparisons between the signals provided to the amplifier and the signals produced by the amplifier. For example, a first signal produced by the first circuit may indicate a comparison between an amount of power provided to a positive terminal of the amplifier and an amount of power provided by the amplifier (e.g., an output). To continue this example, a second signal produced by the first circuit may indicate a comparison between an amount of power provided to a negative terminal of the amplifier and the amount of power provided by the amplifier. The signals produced by the first signal can be provided to the second circuit. The second circuit can track and/or otherwise monitor the signals produced by the first circuit to determine given components that may control the amount of power provided to the terminals of the amplifier. The second circuit controlling the amount of power provided to the terminal of the amplifier may result in maintaining a voltage bracket for the amplifier, in some embodiments.

The device can be in communication with an amplifier (e.g., a driver). The communication between the device and the driver can be direct (e.g., the device is directly connected to the driver and the device directly communicates with the driver) and/or indirect (e.g., a component receives signals from the driver and the component provides the signals to the device) in some embodiments. The communication between the device and the driver can include the device and driver being electrically coupled with one another. The device can also be in similar communication with a power supply and/or power supply device that can provide power to the supply terminals of the driver. The device can provide signals that cause an amount of power provided to the supply terminals of the driver to controlled and/or otherwise adjusted.

The system may refer to and/or include at least one of Application-Specific Integrated Circuits (ASIC), capacitive load components, display drivers, touch screens, keyboard sensors, mobile devices, and/or among other possible touch controllers. The device may refer to and/or include at least one an integrated circuit, a general purpose processor, a multicore processor, a software programmable device, a programmable logic controller, and/or among other possible circuitry and/or hardware, in some embodiments. Similarly, the functionality of the device may be stored, in memory, as software and/or as instructions and when the information (e.g., the software and/or instructions) stored in memory are executed, by a processor, results in the processor performing the functionality of the device (e.g., the processor can monitor output signals and control an amount of power provided to the driver) and/or performing the functionality of a component of the device (e.g., the first circuit and/or the second circuit).

The first circuit may refer to and/or include at least one of an operational amplifier (Opamp), a comparator circuit, an integrated circuit, a software programmable device, a programmable logic controller, and/or among other possible circuitry and/or hardware, in some embodiments. The second circuit may refer to and/or include at least one of an Opamp, a comparator circuit, filters, a digital signal processing engine, a pattern generator (e.g., a device that sends control signals to components of the device and/or the system), Flip Flops, logic gates, latches, state storage, an integrated circuit, a software programmable device, a programmable logic controller, and/or among other possible circuitry and/or hardware, in some embodiments.

The driver may refer to and/or include at least one of a driver circuit, an integrated circuit, an operational amplifier (Opamp), a regulator, a software programmable device, a programmable logic controller, and/or among other possible circuitry and/or hardware, in some embodiments. A power source may refer to at least one of a power supply device, passive electronic components, power storage devices, power rails, and/or among other possible circuitry and/or hardware, in some embodiments.

An amount of power may refer to at least one of a voltage level of a signal, an amount of power of a signal, an amount of current of a signal, and/or various combinations, in some embodiments. A difference between signals may refer to an indication of which signal (e.g., a first signal or a second signal) is larger and/or smaller from each other, a binary value (e.g., a zero or a one) to indicate whether a first signal is higher and/or lower than a second signal, and/or among various combinations, in some embodiments. A difference between an amount of power provided to a first terminal of the driver and an amount of power provided to a second terminal of the driver may refer to and/or include at least one of a voltage bracket, voltage stress, a difference between voltage levels at a positive terminal of the driver and a negative terminal of the driver. A threshold between an amount of power and a signal may refer to at least one of offsetting a value and/or level (e.g., adding and/or removing voltage from the signal) of the signal to produce a difference between the amount of power and the signal, counteract a value and/or a level of the signal to adjust when a value and/or level of the amount of power is larger than and/or smaller than the signal, in some embodiments.

A first set of components may refer to at least one of a voltage source (e.g., batteries, current through resistors, etc.), circuitry hardware (e.g., transistors, resistors, capacitors, inductors, switches, diodes, etc.), and/or among various combinations, in some embodiments. A second set of components may refer to at least one of a voltage source (e.g., batteries, current through resistors, etc.), circuitry hardware (e.g., transistors, resistors, capacitors, inductors, switches, diodes, etc.), and/or among various combinations, in some embodiments. Control may refer to at least one of transmitting signals to adjust a configuration of components, transmitting signals to electrically couple components with one another, transmitting signals to electrically decouple components from one another, transmitting signals to control operation of a component, and/or among various combinations, in some embodiments. Polarity may refer to at least one of positive signals, negative signals, positive voltage levels, negative voltage levels, signals having voltage levels larger than zero, signals having voltage levels less than zero, and/or among various combinations, in some embodiments.

Some embodiments relate to a system. The system includes a device. The device includes a first circuit and a second circuit. The first circuit can receive a first signal to indicate a first amount of power provided to a first terminal of a driver. The first circuit can also receive a second signal to indicate a second amount of power provided to a second terminal of the driver. The first circuit can also receive a third signal to indicate a third amount of power provided by the driver. The first circuit can also provide a fourth signal, the fourth signal can have a first level in response to a level of the first signal being larger than a level of third signal, and the fourth signal can have a second level in response to the level of the third signal being larger than level of the first signal. The first circuit can also provide a fifth signal, the fifth signal can have a first level in response to a level of the second signal being larger than the level of the third signal, and the fifth signal can have a second level in response to the level of the third signal being larger than the level of the second signal. The second circuit can receive the fourth signal and the fifth signal, and determine, based on the fourth signal and the fifth signal, whether to control a first set of components to maintain a difference between the first amount of power and the second amount of power or a second set of components to maintain the difference between the first amount of power and the second amount of power.

In some embodiments, the level of the first signal can include a first level, the level of the second signal can include a first level, and the system can include a power source and a second power source. The power source can electrically couple with the first circuit. The power source can also adjust the first signal from the first level to a second level, and produce, responsive to adjusting the first signal from the first level to the second level, a first threshold between the first signal and the third signal. The second power source can electrically couple with the first circuit. The second power source can also adjust the second signal from the first level to a second level, and produce, responsive to adjusting the second signal from the first level to the second level, a second threshold between the second signal and the third signal.

In some embodiments, the second circuit can provide a sixth signal and a seventh signal to indicate control of the first set of components or the second set of components. The first threshold can result in the fourth signal having the second level prior to the level of the third signal exceeding the first level of the first signal, and the second threshold can result in the fifth signal having the first level prior to the first level of the second signal exceeding the level of the third signal.

In some embodiments, the second circuit can provide a sixth signal and a seventh signal to indicate control of the first set of components or the second set of components. The system can include a power source. The power source can electrically couple with the first terminal of the driver and the power source can provide a first level of the first amount of power. The first set of components, in response to the sixth signal having a first level, can electrically couple the power source with the second terminal of the driver to adjust, from a first level to a second level, the second amount of power, and electrically couple a second power source with the first terminal of the driver to adjust, from the first level to a second level, the first amount of power. The first set of components, in response to the sixth signal having a second level, can electrically decouple the power source from the second terminal of the driver, and electrically decouple the second power source from the first terminal of the driver.

In some embodiments, the second level of the first amount of power can exceed, in response to the fourth signal having the second level, a level of the third amount of power, and the second level of the second amount of power can maintain the difference between the first amount of power and the second amount of power.

In some embodiments, a difference between the first level of the first amount of power and the first level of the second amount of power can have a first value. A difference between the second level of the first amount of power and the second level of the second amount of power can have a second value, and the first value and the second value can be the same.

In some embodiments, the second circuit can provide a sixth signal and a seventh signal to indicate control of the first set of components or the second set of components. The second set of components, in response to the seventh signal having a first level, can electrically decouple a power source from the first terminal of the driver, and electrically couple a second power source with the second terminal of the driver. The second set of components, in response to the seventh signal having a second level, can electrically decouple the second power source from the second terminal of the driver, and electrically couple the power source with the first terminal of the driver.

In some embodiments, the power source can provide, in response to the power source being electrically coupled with the first terminal of the driver, a first level of the first amount of power. The first level of the first amount of power can exceed, in response to the fourth signal having the first level, a first level of the third amount of power. The second power source can provide, in response to the second power source being electrically coupled with the second terminal of the driver, a first level of the second amount of power, and the first level of the second amount of power can exceed, in response to the fifth signal having the first level, a second level of the third amount of power.

In some embodiments, the first level of the first amount of power can have a first amplitude and a first polarity. The first level of the second amount of power can have a second amplitude and a second polarity. The first amplitude and the second amplitude can be the same, and the first polarity and the second polarity can be different.

In some embodiments, the system can include a power source. The power source can adjust, from a first level to a second level, the first amount of power. The power source can also produce, responsive to adjusting the first amount of power, a difference between the first amount of power and the third amount of power. The difference between the first amount of power and the third amount of power can be produced in response to the fourth signal having the second level.

In some embodiments, the power source can adjust, from a first level to a second level, the second amount of power. The power source can also produce, responsive to adjusting the second amount of power, a difference between the second amount of power and the third amount of power. The difference between the second amount of power and the third amount of power can be produced in response to the fifth signal having the first level.

Some embodiments relate to a device. The device includes a first circuit and a second circuit. The first circuit can receive a first signal to indicate a first amount of power provided to a first terminal of a driver. The first circuit can also receive a second signal to indicate a second amount of power provided to a second terminal of the driver. The first circuit can also receive a third signal to indicate a third amount of power provided by the driver. The first circuit can also provide a fourth signal, the fourth signal can have a first level in response to a level of the first signal being larger than a level of third signal, and the fourth signal can have a second level in response to the level of the third signal being larger than level of the first signal. This first circuit can also provide a fifth signal, the fifth signal can have a first level in response to a level of the second signal being larger than the level of the third signal, and the fifth signal can have a second level in response to the level of the third signal being larger than the level of the second signal. The second circuit can receive the fourth signal and the fifth signal, and determine, based on the fourth signal and the fifth signal, whether to control a first set of components to maintain a difference between the first amount of power and the second amount of power or a second set of components to maintain the difference between the first amount of power and the second amount of power.

In some embodiments, the level of the first signal can include a first level, the level of the second signal can include a first level, and the device can include a power source and a second power source. The power source can electrically couple with the first circuit. The power source can also adjust the first signal from the first level to a second level, and produce, responsive to adjusting the first signal from the first level to the second level, a first threshold between the first signal and the third signal. The second power source can electrically couple with the first circuit. The second power source can also adjust the second signal from the first level to a second level, and produce, responsive to adjusting the second signal from the first level to the second level, a second threshold between the second signal and the third signal.

In some embodiments, the second circuit can provide a sixth signal and a seventh signal to indicate control of the first set of components or the second set of components. The first threshold can result in the fourth signal having the second level prior to the level of the third signal exceeding the first level of the first signal, and the second threshold can result in the fifth signal having the first level prior to the first level of the second signal exceeding the level of the third signal.

In some embodiments, the second circuit can provide a sixth signal and a seventh signal to indicate control of the first set of components or the second set of components. The device can include a power source. The power source can electrically couple with the first terminal of the driver and the power source can provide a first level of the first amount of power. The first set of components, in response to the sixth signal having a first level, can electrically couple the power source with the second terminal of the driver to adjust, from a first level to a second level, the second amount of power, and electrically couple a second power source with the first terminal of the driver to adjust, from the first level to a second level, the first amount of power. The first set of components, in response to the sixth signal having a second level, can electrically decouple the power source from the second terminal of the driver, and electrically decouple the second power source from the first terminal of the driver.

In some embodiments, the second level of the first amount of power can exceed, in response to the fourth signal having the second level, a level of the third amount of power, and the second level of the second amount of power can maintain the difference between the first amount of power and the second amount of power.

In some embodiments, a difference between the first level of the first amount of power and the first level of the second amount of power can have a first value. A difference between the second level of the first amount of power and the second level of the second amount of power can have a second value, and the first value and the second value can be the same.

In some embodiments, the second circuit can provide a sixth signal and a seventh signal to indicate control of the first set of components or the second set of components. The second set of components, in response to the seventh signal having a first level, can electrically decouple a power source from the first terminal of the driver, and electrically couple a second power source with the second terminal of the driver. The second set of components, in response to the seventh signal having a second level, can electrically decouple the second power source from the second terminal of the driver, and electrically couple the power source with the first terminal of the driver.

In some embodiments, the power source can provide, in response to the power source being electrically coupled with the first terminal of the driver, a first level of the first amount of power. The first level of the first amount of power can exceed, in response to the fourth signal having the first level, a first level of the third amount of power. The second power source can provide, in response to the second power source being electrically coupled with the second terminal of the driver, a first level of the second amount of power, and the first level of the second amount of power can exceed, in response to the fifth signal having the first level, a second level of the third amount of power.

Some embodiments relate to a method for maintaining a difference between an amount of power provided to a first terminal of a driver and an amount of power provided to a second terminal of the driver. The method can include receiving, by a first circuit, a first signal to indicate the amount of power provided to the first terminal of the driver. The method can also include receiving, by the first circuit, a second signal to indicate the amount of power provided to the second terminal of the driver. The method can also include receiving, by the first circuit, a third signal to indicate a third amount of power provided by the driver. The method can also include providing, by the first circuit, a fourth signal, the fourth signal can have a first level in response to the first signal being larger than the third signal, and the fourth signal can have a second level in response to the third signal being larger than the first signal. The method can also include providing, by the first circuit, a fifth signal, the fifth signal can have a first level in response to the second signal being larger than the third signal, and the fifth signal can have a second level in response to the third signal being larger than the second signal. The method can also include receiving, by a second circuit, the fourth signal and the fifth signal. The method can also include determining, by the second circuit based on the fourth signal and the fifth signal, whether to control a first set of components to maintain the difference between the amount of power provided to the first terminal of the driver and the amount of power provided to the second terminal of the driver, or a second set of components to maintain the difference between the amount of power provided to the first terminal of the driver and the amount of power provided to the second terminal of the driver.

FIG. 1 depicts a block diagram of a system 100, according to some embodiments. In some embodiments, the system 100 includes at least one device 105, at least one power supply 120, at least one driver 125, and at least one component 130. The power supply 120 can be and/or include at least one of the power sources and/or power supply described herein. For example, the power supply 120 can provide power to a power supply terminal of the driver 125 (e.g., to a pair of power supply terminals (e.g., positive, negative, power, ground, etc.)). The power supply 120 can also provide an input signal to the device 105. For example, the power supply 120 can be electrically coupled with both the driver 125 and the device 105. The power supply 120 can include a converter circuit, a regulator, a battery, a storage capacitor, or any apparatus for providing a power signal. The driver 125 can be and/or include the driver described herein. For example, the driver 125 can provide an output signal to the device 105.

The device 105 can be and/or include the device described herein. In some embodiments, the device 105 includes one or more comparators 110 and one or more signal processors 115. The comparators 110 can be and/or include the first circuit described herein. The signal processors 115 can be and/or include the second circuit described herein. The comparators 110 can receive one or more signals. For example, the comparators 110 can receive one or more signals from the power supplies 120 (indicated as Terminal Supply in FIG. 1) and the comparators 110 can receive one or more signals from the driver 125 (indicated as Output Signal in FIG. 1).

The Terminal Supply signals may refer to, correspond to, and/or otherwise indicate an amount of power that is provided to at least one power supply terminal (e.g., a terminal) of the driver 125. For example, the power supply terminals of the driver 125 may receive, from the power supplies 120, an amount of power that includes a voltage level of a given amount and/or value. The voltage level included in the amount of power that is provided to the supply terminals of the driver 125 may also be provided to the comparators 110 (e.g., the Supply Terminal signals). The Output Supply signals may refer to, correspond to, and/or otherwise indicate an amount of power that is provided by the driver 125. For example, the driver 125 may receive a signal and then provide an amplified signal. The amplified signal may include a voltage level of a given amount and/or value. The voltage level that is included in the amplified signal (e.g., the amount of power provided by the driver 125) may also be provided to the comparators 110 (e.g., the Output signals).

The comparators 110 can receive a signal to indicate an amount of power provided to a first terminal of the driver 125. For example, the comparators 110 can receive a first Terminal supply signal indicating an amount of power provided to the first terminal of the driver 125. The first Terminal Supply signal may include a voltage level that indicates the amount of power provided to the first terminal of the driver 125. The comparators 110 can also receive a signal to indicate an amount of power to a second terminal of the driver 125. For example, the comparators 110 can receive a second Terminal Supply signal indicating an amount of power provided to the second terminal of the driver 125. The second Terminal Supply signal may include a voltage level that indicates the amount of power provided to the second terminal of the driver 125.

The comparators 110 can receive a signal to indicate an amount of power provided by the driver 125. For example, the comparators can receive a first Output Signal indicating an amount of power provided by the driver 125. The first Output Signal may include a voltage level that indicates the amount of power provided by the driver 125.

The comparators 110 can also provide one or more signals. For example, the comparators 110 can provide one or more signals to the signal processors 115 (indicated as Comparison Signal in FIG. 1). The comparators 110 can compare one or more signals to determine which signal is larger and/or smaller. For example, the comparators 110 can compare the first Terminal Supply signal with the first Output Signal to determine which signal is larger. The comparators 110 may also compare the second Terminal Supply Signal with the first Output Signal.

The comparators 110 can provide a signal to indicate a difference between an amount of power provided to a terminal of the driver 125 and an amount of power provided by the driver 125. For example, the comparators 110 can provide a first Comparison Signal to indicate a difference between the first Terminal Supply signal and the first Output Signal. The comparators may also provide a second Comparison Signal to indicate a difference between the second Terminal Supply Signal and the first Output Signal.

The first Comparison Signal can have a first level in response to the first Terminal Supply signal being larger than the first Output Signal. The first Comparison Signal can have a second level in response to the first Output Signal being larger than the first Terminal Supply signal. The first level and the second level may include a voltage level. For example, the first Comparison signal a voltage level of 0V (e.g., the first level) may indicate that the first Terminal Supply signal is larger than the first Output Signal and a voltage level of 1V (e.g., the second level) may indicate that the first Output Signal is larger than the first Terminal Supply signal.

The second Comparison Signal can have a first level in response to the second Terminal Supply signal being larger than the first Output Signal. The second Comparison Signal can have a second level in response to the first Output Signal being larger than the second Terminal Supply signal. The first level and the second level may include a voltage level. For example, the second Comparison signal having a voltage level of 1V (e.g., the first level) may indicate that the second Terminal Supply signal is larger than the first Output Signal and a voltage level of 0V (e.g., the second level) may indicate that the first Output Signal is larger than the second Terminal Supply signal.

As a non-limiting example, the first Terminal Supply signal may include a voltage level of 5V and the first Output Signal may include a voltage level of 3V. In this example, the comparators 110 can determine that the first Terminal Supply signal is larger than the first Output Signal. The comparators 110 can provide the first Comparison Signal to indicate the difference between the first Terminal Supply signal and the first Output Signal. For example, the first Comparison Signal may have the first level to indicate that the first Terminal Supply signal is larger than the first Output Signal.

As another non-limiting example, the second Terminal Supply signal may include a voltage level of 0V and the first Output Signal may include a voltage level of 2V. In this example, the comparators 110 can determine that the first Output Signal is larger than the second Terminal Supply signal. The comparators 110 can provide the second Comparison Signal to indicate the difference between second Terminal Supply signal and the first Output Signal. For example, the second Comparison Signal may have the second level to indicate that the first Output Signal is larger than the Second Terminal Supply signal.

While the examples described herein, with respect to comparing and/or determining differences between signals (e.g., which signal is larger and/or smaller), pertained to signals including voltage levels greater than and/or equal to 0 (e.g., positive values), the comparison of the signals may include voltage levels less than 0 (e.g., negative values). When signals include voltage levels having negative values, the comparison between signals may be absolute and/or relative.

As a non-limiting example, the second Terminal Supply signal may include a voltage level 0V-5V and the first Output Signal may include a voltage level of 0V. In this example, the comparison between the second Terminal Supply signal and the first Output Signal may be absolute. The comparators 110 may take an absolute value (e.g., make all values positive) and then determine which signal is larger. In the example, the absolute value of the voltage level included in the second Terminal Supply signal may be 5V. The absolute value of the voltage level included in the first Output Supply signal would still be 0V. In this example, the second Terminal Supply Signal may be larger than the first Output Signal.

As another non-limiting example, the second Terminal Supply signal may include a voltage level 0f –3V and the first Output Signal may include a voltage level of –1V. In this example, the comparison between the second Terminal Supply signal and the first Output Signal may be relative. When the comparison is relative, the comparators 110 may determine which signal include a voltage level that is more positive (e.g., which signal is closer to 0V). The signal closest to 0V may be the larger signal. In this example, the voltage level of the first Output Signal (e.g., –1V) is closer to 0V than the voltage level of the second Supply Terminal signal (e.g., –3V). The first Output Signal may be larger than second Terminal Supply signal.

The components 130 can be and/or include at least one of transistors, diodes, circuit switches, latches, passive elements (e.g., resistors, inductors, capacitors, etc.), voltage sources, current sources, and/or among other possible hardware and/or circuit elements. The transistors can include Metal-Oxide-Semiconductor Field-Effect Transistors (MOSFETs), Complementary Metal-Oxide-Semiconductors (CMOS), and/or among other possible types of transistors. The components 130 can also include one or more sets of components 130. For example, the components 130 may include a first set of components 130 and a second set of components 130.

The first set of components 130 may have one or more configurations. The configurations of the first set of components 130 may be and/or include at least one of a placement, a position, a status, a state, and/or an orientation of the first set of components 130. For example, the first set of components 130 may be switches and the first set of components 130 may have a first configuration when the switches are open, and the first set of components may have a second configuration when the switches are closed. The configurations of the first set of components 130 may alter, change, and/or otherwise adjust the amount of power provided to the terminals of the driver 125. For example, the first set of components 130 moving from a first configuration to a second configuration may electrically decouple a power source from the terminals of the driver 125. The electric decoupling of the power source from the terminals of the driver 125 may decrease the amount of power provided to the terminals of the driver 125.

The second set of components 130 may have one or more configurations. The configurations of the second set of components 130 may be and/or include at least one of a placement, a position, a status, a state, and/or an orientation of the first set of components 130. For example, the second set of components 130 may be switches and the second set of components 130 may have a first configuration when the switches are closed, and the second set of components may have a second configuration when the switches are open. The configurations of the second set of components 130 may alter, change, and/or otherwise adjust the amount of power provided to the terminals of the driver 125. For example, the second set of components 130 moving from a first configuration to a second configuration may electrically couple a power source with the terminals of the driver 125. The electric coupling of the power source with the terminals of the driver 125 may increase the amount of power provided to the terminals of the driver 125.

The signal processors 115 can receive one or more signals. For example, the signal processors 115 may receive the first Comparison Signal and the second Comparison Signal. The signal processors 115 can determine, based on the first Comparison Signal and the second Comparison Signal, when to control the components 130. For example, the signal processors 115 may determine that the first Comparison Signal has the second level (e.g., the first Output Signal is larger than the first Terminal Supply signal).

The signal processors 115 can provide one or more signals. For example, the signal processors 115 can provide signals to the components 130 (indicated as Control Signal in FIG. 1). The signal processors 115 can provide a first Control Signal to the first set of components 130 and the signal processors 115 can provide a second Control Signal to the second set of components 130. The first Control Signal and the second Control signal may indicate control of the first set of components 130 or control of the second set of components 130. For example, the first Control Signal and/or the second Control Signal may have a first level and a second level. The first level of the first Control Signal may indicate no change and/or no control (e.g., maintain the configuration of the first set of components 130). The second level of the first Control Signal may indicate control (e.g., move the first set of components 130 from the first configuration to the second configuration).

The signal processors 115 may control, responsive to determining that the first Comparison Signal has the second level, the first set of components 130. For example, the signal processors 115 may transmit the first Control Signal to the first set of components 130. The signal processors 115 may also determine that the second Comparison Signal has the first level (e.g., the second Terminal Supply signal is larger than the first Output Signal). The signal processors 115 may control, responsive to determining that the second Comparison Signal has the first level, the second set of components 130. For example, the signal processors 115 may transmit the second Control Signal to the second set of components 130.

The signal processors 115 may control the first set of components 130 to have the first set of components 130 move from a first configuration to a second configuration. The first Output signal being larger than the first Terminal Supply signal may result in clipping (e.g., the amount of power provided to the driver 125 is less than the amount of power provided by the driver 125). The signal processors 115 may control the first set of components 130 to increase the amount of power provided to the first terminal of the driver 125 (e.g., increase the voltage level of the first Terminal Supply signal).

The first set of components 130 moving from the first configuration to the second configuration may electrically couple a power source with the terminals of the driver 125. The electrically coupling of the power source with the terminals of the driver 125 may increase the voltage level of the first Terminal Supply signal and the second Terminal Supply signal. For example, the first Terminal Supply signal may have its voltage level increased from 5V to 10V and the second Terminal Supply signal may have its voltage level increased from 0V to 5V.

The signal processors 115 may also control the first set of components 130 to maintain a difference between the amount of power provided to the first terminal of the driver 125 and the amount of power provided to the second terminal of the driver 125 (e.g., maintain a voltage bracket between the first Terminal Supply signal and the second Terminal Supply signal). For example, the driver 125 may have a voltage bracket of 5V between the first Terminal Supply signal and the second Terminal Supply signal. The signal processors 115 may maintain the voltage bracket by increasing and/or decreasing both the voltage level of the first Terminal Supply signal and the voltage level of the second Terminal Supply signal by a similar amount. For example, the signal processors 115 controlling the first set of components 130 may cause the voltage level of the first Terminal Supply signal to increase by 3V. To maintain the voltage bracket of the driver 125, the signal processors 115 may control the first set of components 130 to also have the voltage level of the second Terminal Supply signal also increase by 3V.

The signal processors 115 may also control the second set of components 130 to maintain a difference between the amount of power provided to the first terminal of the driver 125 and the amount of power provided to the second terminal of the driver 125 (e.g., maintain a voltage bracket). The signal processors 115 can maintain the difference (e.g., maintain the voltage bracket) between terminals of the driver 125 by increasing, decreasing, and/or maintaining the amount of power provided to the first terminal and the second terminal by a similar amount.

As a non-limiting example, the voltage bracket between the first terminal and the second terminal of the driver 125 may be 5V (e.g., the difference between the first Terminal Supply signal and the second Terminal Supply signal). In this example, at a first point in time, the first Terminal Supply signal may include a voltage level of 5V. The second Terminal Supply signal may include a voltage level of 0V. The difference between the first Terminal Supply signal and the second Terminal Supply signal is 5V (e.g., the voltage bracket).

To continue the non-limiting example, at a second point in time, the signal processors 115 may determine that the first Comparison Signal has the second level (e.g., the Output Signal is larger than the first Terminal Supply signal). For example, the Output Signal may have a voltage level set to exceed 5V. To prevent clipping, the voltage level of the first Terminal Supply signal may be increased. For example, the signal processors 115 may control the first set of components 130 to increase the voltage level of the first Terminal Supply signal from 5V to 10V.

In this non-limiting example, if the voltage level of the second Terminal Supply signal were to stay at 0V, the resulting voltage bracket between the first Terminal Supply signal and the second Terminal Supply signal would be 10V. The change in the voltage bracket may be problematic when the change is larger than the voltage tolerance of the drivers. For example, some drivers may have a voltage tolerance of 5.5V and the drivers may not be able to handle a voltage bracket and/or a voltage stress that is larger than its voltage tolerance. To maintain the voltage bracket of 5V, the signal processors 115 may also control the first set of components 130 to have the voltage level of the second Supply Terminal signal be increased from 0V to 5V.

The signals described herein can be at least one of sequential signals (e.g., the first Terminal Supply signal is followed by the second Terminal Supply signal, etc.), continuous signals (e.g., the first Terminal Supply signal is continually provided but the value of the first Terminal Supply signal may change), semi-continuous signal (e.g., the first Output Supply signal is provided intermittently responsive to a change in the voltage level of the first Output Supply signal), non-consecutive signals (e.g., the first Terminal Supply signal is not immediately followed by the second Terminal Supply signal), and/or among other possible combinations. For clarity, when a first power supply and a second power supply are discussed herein the first power supply may have a lower voltage value in comparison to a voltage value of the second power supply. However, the power supplies and/or power sources described herein can have and/or include varying voltage values, voltage types (e.g., AC, DC, etc.), varying configuration, and/or various locations.

Figure 2:
FIG. 2 is a schematic block diagram of the system illustrated in FIG. 1, according to some embodiments.

FIG. 2 depicts a schematic diagram 200 including elements of the system 100, according to some embodiments. The schematic diagram 200 includes the comparators 110, the signal processors 115, the driver 125, and the components 130, in some embodiments. The comparators 110 can include one or more Opamps 210 and/or one or more comparator circuits 210. For example, as shown in FIG. 2, the comparators 110 can include a first Opamp 210 and a second Opamp 210. In some embodiments, at least one of the first Opamp 210 and/or the second Opamp 210 can perform similar functions to that of the comparators 110. The first Opamp 210 and the second Opamp 210 can both receive one or more signals. The first Opamp 210 and the second Opamp 210 can also both provide one or more signals.

The first Opamp 210 is shown electrically coupled with both the driver 125 and a supply line 217. The supply line 217, as shown in FIG. 2, is electrically coupled with a terminal 219 of the driver 125. The terminal 219 may be and/or include the first terminal of the driver 125 described herein. Power produced and/or otherwise provided by at least one power source (e.g., the power supplies 120) can be transmitted by the supply line 217. For example, the supply line 217 can provide an amount of power to the terminal 219. The amount of power transmitted by the supply line 217 is shown as Terminal Supply 1 in FIG. 2. The Terminal Supply 1 may be and/or include the first Terminal Supply signal described herein.

The first Opamp 210 may receive a signal to indicate an amount of power provided to the terminal 219. For example, the first Opamp 210 may receive the first Terminal Supply signal. The first Opamp 210 may also receive a signal to indicate an amount of power provided by the driver 125. For example, the first Opamp 210 may receive the first Output Signal. The first Output Signal may include a voltage level. The voltage level of the first Output Signal is illustrated as $V_{out}$ in FIG. 2. The first Opamp 210 can compare the first Terminal Supply signal with the first Output Signal to determine which signal is larger and/or smaller. The first Opamp can provide a signal to indicate the difference between the first Terminal Supply signal and the first Output Signal (e.g., the first Comparison signal). The signal provided by the first Opamp 210 is illustrated as Vout_is_High is FIG. 2. The Vout_is_High signal is illustrated in FIG. 2 as being provided to the signal processors 115.

The second Opamp 210 is shown electrically coupled with both the driver 125 and a supply line 221. The supply line 221, as shown in FIG. 2, is electrically coupled with a terminal 223 of the driver 125. The terminal 223 may be and/or include the second terminal of the driver 125 described herein. Power produced and/or otherwise provided by at least one power source (e.g., the power supplies 120) can be transmitted by the supply line 221. For example, the supply line 221 can provide an amount of power to the terminal 223. The amount of power transmitted by the supply line 221 is shown as Terminal Supply 2 in FIG. 2. The Terminal Supply 2 may be and/or include the second Terminal Supply signal described herein.

The second Opamp 210 may receive a signal to indicate an amount of power provided to the terminal 223. For example, the second Opamp 210 may receive, via the supply line 221, the second Terminal Supply signal. The second Opamp 210 may also receive a signal to indicate an amount of power provided by the driver 125. For example, the second Opamp 210 may receive the first Output Signal. The second Opamp 210 can compare the second Terminal Supply signal with the first Output Signal to determine which signal is larger and/or smaller. The second Opamp can provide a signal to indicate the difference between the second Terminal Supply signal and the first Output Signal (e.g., the second Comparison signal). The signal provided by the first Opamp 210 is illustrated as Vout_is_Low is FIG. 2. The Vout_is_Low signal is illustrated in FIG. 2 as being provided to the signal processors 115.

In some embodiments, the Vout_is_High signal may have a first level and a second level. The first level of the Vout_is_High signal may indicate that the first Terminal Supply signal is larger than the first Output Signal. For example, the first level may include a voltage level of 0V. The second level of the Vout_is_High may indicate that the first Output Signal is larger than the first Terminal Supply signal. For example, the second level may include a voltage level of 1V.

In some embodiments, the Vout_is_Low signal may have a first level and a second level. The first level of the Vout_is_Low signal may indicate that the second Terminal Supply signal is larger than the first Output Signal. For example, the first level may include a voltage level of 1V. The second level of the Vout_is_Low may indicate that the first Output Signal is larger than the second Terminal Supply signal. For example, the second level may include a voltage level of 0V.

The first Opamp 210 is shown electrically coupled with a power source 211. The power source 211 may be and/or include at least one of the power sources and/or power supplies described herein. The power source 211 may electrically couple the first Opamp 210 with the supply line 217. The power source 211 is shown to include a voltage level of $V_{th\_H}$. The orientation and/or the placement of the power source 211 between the supply line 217 and the first Opamp 210 may result in the power source 211 adjusting the level of the first Terminal Supply signal that is received by the first Opamp 210. For example, the power source 211 may adjust the first Terminal Supply signal from a first level (e.g., Terminal Supply 1) to a second level (e.g., Terminal Supply $1-V_{th\_H}$).

The power source 211 can produce, responsive to adjusting the first Terminal Supply signal from the first level to the second level, a threshold between Terminal Supply 1 and the first Output Supply signal. The threshold produced by the power source 211 may modify, adjust, and/or otherwise change a difference between the level of the first Terminal Supply Signal and the first Output Signal. For example, the Terminal Supply 1 may include a voltage level of 5V (e.g., the amount of power provided to the terminal of the driver 125) and the first Output Signal may include a voltage level of 4.8V. However, the voltage level of the first Terminal Supply signal received by the first Opamp 210 may be $5V-V_{th\_H}$. In this example, the difference between Terminal Supply 1 and the first Output Supply signal may be 0.2V. However, the difference between the first Terminal Supply signal and the first Output Supply signal may be $5V-4.8V-V_{th\_H}$. In this example, based on the voltage level of $V_{th\_H}$, the first Opamp 210 may determine that the first Output Supply signal is larger than the first Terminal Supply signal prior to the voltage level of the first Output Supply signal exceeding the voltage level of the Terminal Supply 1.

The threshold produced by the power source 211 may prevent clipping of the first Output Signal as the amount of power provided to the terminal 219 (e.g., Terminal Supply 1) may be increased, by the signal processors 115, prior to the first Output Signal exceeding Terminal Supply 1. For example, Terminal Supply 1 may be 5V and a voltage level of the first Output Signal may be 4.2V. In this example, the threshold produced by the power source 211 may result in the first Opamp 210 indicating that the first Output Supply signal is larger than Terminal Supply 1 (e.g., Vout_is_high Signal may have the second level).

The second Opamp 210 is shown electrically coupled with a power source 213. The power source 213 may be and/or include at least one of the power sources and/or power supplies described herein. The power source 213 may electrically couple the second Opamp 210 with the supply line 221. The power source 213 is shown to include a voltage level of $V_{th\_L}$. The orientation and/or the placement of the power source 213 between the supply line 217 and the second Opamp 210 may result in the power source 213 adjusting the level of the second Terminal Supply signal received by the second Opamp 210. For example, the power source 213 may adjust the second Terminal Supply signal from a first level (e.g., Terminal Supply 2) to a second level (e.g., Terminal Supply $2+V_{th\_L}$).

The power source 213 can produce, responsive to adjusting the second Terminal Supply signal from the first level to the second level, a threshold between Terminal Supply 2 and the first Output Supply signal. For example, Terminal Supply 2 may include a voltage level of 0V and the first Output Supply signal may include a voltage level of 0.8V. In this example, the difference between Terminal Supply 2 and the first Output Supply signal may be –0.8V (e.g., 0-0.8V). However, the difference between the second Terminal Supply signal and the first Output Supply signal may be $-0.8V+V_{th\_L}$. In this example, based on the voltage level of $V_{th\_L}$, the second Opamp 210 may determine that the second Terminal Supply signal is larger than the first Output Supply signal prior to the voltage level of the Terminal Supply 2 exceeding the voltage level Output Supply signal. In this example, the threshold produced by the power source 213 may result in the second Opamp 210 indicating that Terminal Supply 2 is larger than the first Output Supply signal (e.g., Vout_is_Low signal may have the first level).

The components 130 may include, as illustrated in FIG. 2, a Vout bracketing control 203 and a power source 205, in some embodiments. The Vout bracketing control 203 includes one or more switches 207 and one or more switches 209. In some embodiments, at least one of the switches 207 can be controllable by a first signal (e.g., $\varnothing_1$) of the signal processors 115. In some embodiments, at least one of the switches 207 can be controllable by an inverse of the first signal (e.g., $\overline{\varnothing_1}$). In some embodiments, at least one of the switches 209 can be controllable by a second signal (e.g., $\varnothing_2$) of the signal processors 115. In some embodiments, at least one of the switches 209 can be controllable by an inverse of the first signal (e.g., $\overline{\varnothing_2}$). For example, two of the switches 207 are shown to be controllable by $\varnothing_1$ and one of the switches 207 is to be controllable by $\overline{\varnothing_1}$. The first signal of the signal processors 115 may be a first Control Signal and the second signal of the signal processors 115 may be a second Control Signal. In some embodiments, the first set of components 130 can be and/or include the switches 207. In some embodiments, the second set of components 130 can be and/or include the switches 209. FIG. 2 provides an example of the switches 207 and the switches 209 both having a first configuration.

A power source 215 is shown, as illustrated in FIG. 2, to be electrically coupled, via the switches 207 and the switches 209, with both the terminal 219 and the power source 211 via the supply line 217. The power source 215 is shown to include a voltage level of VDD. The power source 215 can provide the voltage level VDD, via the supply line 217, to the terminal 219. In some embodiments, the voltage level of Terminal Supply 1 may be VDD. For example, the first level of Terminal Supply 1 may be VDD. As another example, the voltage level of the first Terminal Supply signal may be VDD$-V_{th\_H}$.

In some embodiments, the switches 207 can, with $\varnothing_1$ having a first level, electrically couple the power source 205 with the terminal 219 via the supply line 217. For example, the first level of $\varnothing1$ may cause the switches to move from the first configuration (e.g., as illustrated in FIG. 2) to a second configuration (e.g., the switches 207 that are open move to being closed and the switches 207 that are closed move to being open). The switches 207 electrically coupling the power source 205 with the terminal 219 may adjust Terminal Supply 1 from a first level (e.g., VDD) to a second level (e.g., VDD$+V_{bat}$). The switches 207 can also, with $\varnothing_1$ having a second level, electrically decouple the power source 205 from the supply terminal of the driver 125. For example, the switches 207 may move from the second configuration back to the first configuration.

The switches 207 can also, with $\varnothing_1$ having the first level, electrically couple the power source 215 with the terminal 223. For example, the switches 207 moving from the first configuration to the second configuration may also electrically coupled the power source 215 with the supply line 221. The switches 207 coupling the power source 215 with the terminal 223 may adjust Terminal Supply 2 from a first level from a first level to a second level. For example, the switches 207 can adjust Terminal Supply 2 from 0V to VDD. The switches 207 can also, with $\varnothing_1$ having the second level, electrically decouple the power source 215 from the terminal 223. For example, the switches 207 moving from the second configuration back to the first configuration may also electrically decouple the power source 215 from the supply line 221.

In some embodiments, the second level of Terminal Supply 1 may exceed the voltage level of the first Output Supply signal in response to the first Output Supply signal being larger than the first Terminal Supply signal. For example, VDD$+V_{bat}$ may be larger than the voltage level of the first Output Supply signal. As described herein, the first Opamp 210 may provide, to the signal processors 115, the Vout_is_high signal. The Vout_is_high signal may have the second level (e.g., the voltage level of the first Output Signal is larger than the voltage level of the first Terminal Supply signal). In this example, the signal processors 115 may the control the first set of components 130 to increase the voltage level of Terminal Supply 1.

In some embodiments, the second level of Terminal Supply 2 may include a voltage level to maintain the difference between Terminal Supply 1 and Terminal Supply 2 (e.g., maintain a voltage bracket between the terminal 219 and the terminal 223). The change in voltage level from the first level to the second level may be the same for both Terminal Supply 1 and Terminal Supply 2. For example, the first level of Terminal Supply 1 may be 5V and the first level of Terminal Supply 2 may be 0V. Is this example, the voltage bracket between the terminal 219 and the terminal 223 is 5V. To continue this example, the second level of Terminal Supply 1 may be 10V (e.g., VDD$+V_{bat}$) and the second level of Terminal Supply 2 may be 5V (e.g., VDD). The voltage bracket between the terminal 219 and the terminal 223 would still be 5V.

The switches 209 can, with $\varnothing_2$ having a first level, electrically decouple the power source 215 from the terminal 219. The switches 209 electrically decoupling the power source 215 from the terminal 219 may adjust Terminal Supply 1 from a first level (e.g., VDD) to a second level (e.g., 0V). The switches 209 can also, with $\varnothing_2$ having a second level, electrically couple the power source 215 with the terminal 219.

The switches 209 can also, with $\varnothing_2$ having the first level, electrically couple the power source 205 with the terminal 223. The switches 209 electrically coupling the power source 205 with the terminal 223 may adjust Terminal Supply 2 from a first level (e.g., 0V) to a second level (e.g., $-V_{bat}$). The switches 209 can also, with $\varnothing_2$ having the second level, electrically decouple the power source 205 from the terminal 223.

The power source 205 can adjust, from a first level to a second level, the amount of power provided to the terminal 219. For example, the switches 207 can stack, place in series, and/or other place the power source 205 to have the voltage level of the power source 205 added to the voltage level of the power source 215. The combined voltage levels can be included in Terminal Supply 1. The power source 205 can also produce, responsive to adjusting the amount of power provided to the first terminal of the driver 125, a difference between Terminal Supply 1 and the first Output Supply signal. The power source 205 can produce the difference responsive to the first Opamp 210 providing the Vout_is_high having the second level (e.g., Vout is larger than VDD$-V_{th\_H}$). The power source 205 can adjust Terminal Supply 1 from the first level to the second level responsive to the switches 207 electrically coupling the power source 205 with the terminal 219.

The power source 205 can also adjust, from a first level to a second level, the amount of power provided to the terminal 223 (e.g., the power source 205 can change Terminal Supply 2 from a first level to a second level. For example, the switches 209 can electrically couple the power source 205 with the terminal 223 via the supply line 221.

The voltage level of the power source 205 can be provided to the terminal of the driver 125. The power source 205 can produce, responsive to adjusting the amount of power provided to the second terminal of the driver, a difference between the amount of power provided to the terminal 223 and the amount of power provided by the driver 125 (e.g., the first Output Signal). For example, the power source 205 can change the voltage level of the terminal 223 of the driver 125 from 0V to −5V. The power source 205 can produce the difference responsive to the second Opamp 210 providing the Vout_is_Low signal having the first level (e.g., Terminal Supply $2+V_{th\_L}$ is larger than Vout).

The power source 215 can provide a first level of Terminal Supply 1 when the power source 215 is electrically coupled with the terminal 219. The first level of Terminal Supply 1 may exceed the level of the first Output Signal when Vout_is_High has the first level (e.g., the first Terminal Signal is larger than the first Output Signal). For example, the first level of Terminal Supply 1 can be 5V and the level of the first Output Signal may be 3V. The first level of Terminal Supply 1 can have an amplitude and a polarity. For example, the amplitude of the first level of Terminal Supply 1 is 5 and the polarity is positive (e.g., the 5V voltage level is positive).

The power source 205 can provide a first level of Terminal Supply 2 when the power source 205 is electrically coupled with the terminal 223. The first level of Terminal Supply 2 may exceed the level of the first Output Signal when Vout_is_Low has the first level (e.g., the Terminal Supply 2 is larger than the first Output Signal). For example, the first level of Terminal Supply 2 can be −5v and the level of the first Output Signal may be −1V. The first level of Terminal Supply 2 can have an amplitude and a polarity. For example, the amplitude of the first level of Terminal Supply 2 is 5 and the polarity is negative (e.g., the voltage level is negative). The amplitude of the first level of Terminal Supply 1 and the amplitude of the first level of Terminal Supply 2 may be the same. The polarity of Terminal Supply 1 and the polarity of Terminal Supply 2 may be different.

Figure 3:
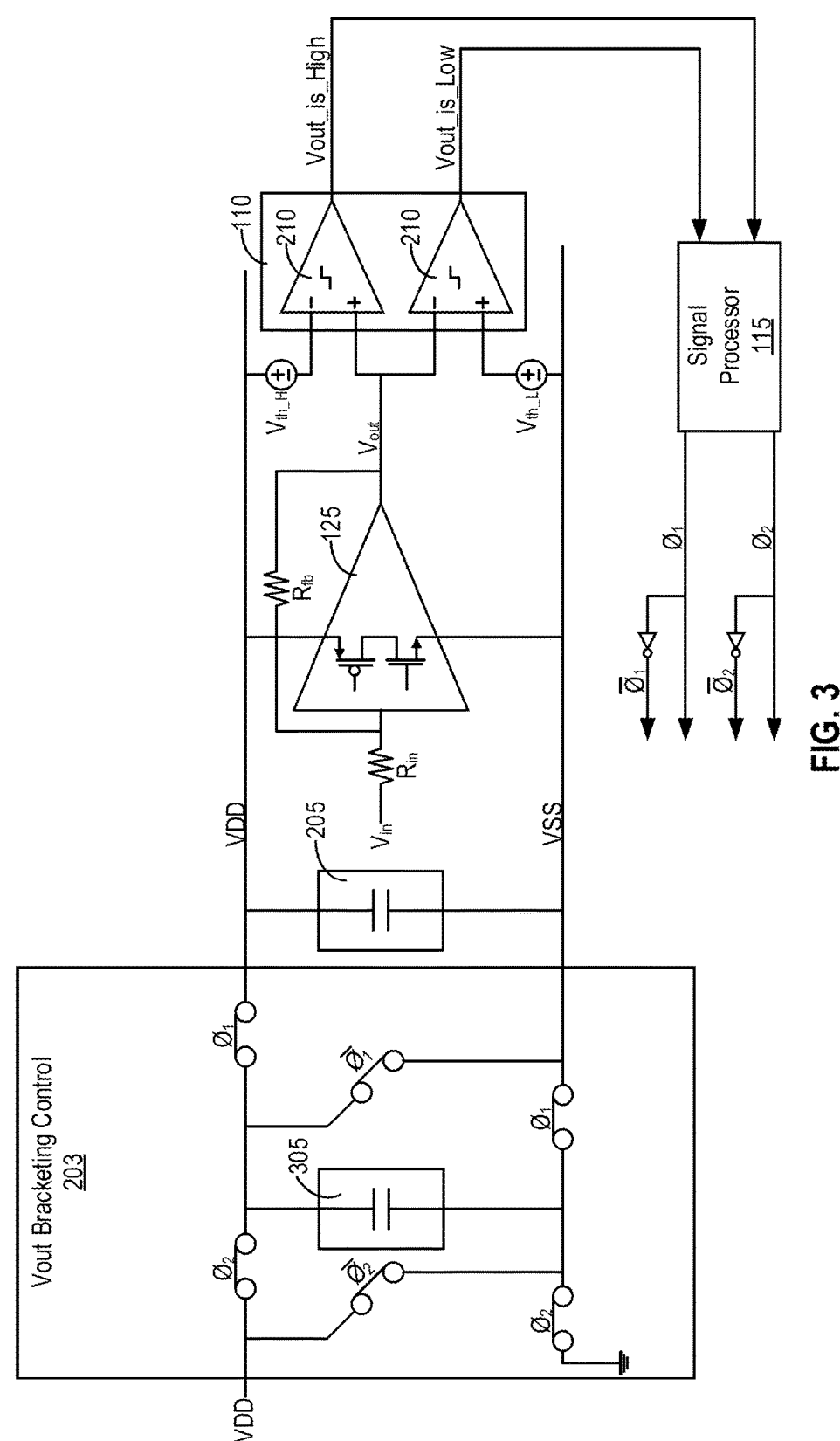
FIG. 3 is a schematic block diagram of the system illustrated in FIG. 1, according to some embodiments.

FIG. 3 depicts a schematic diagram 300 including elements of the system 100, according to some embodiments. The Vout bracketing control 203 includes a power source 305 that can be electrically coupled with the first terminal of the driver 125 and/or with the second terminal of the driver 125 based on the switches 207 and/or the switches 209. The power source 305 can adjust the amount of power that is provided to the first terminal of the driver 125 and the amount of power that is provided to the second terminal of the driver 125. For example, the power source 305 can increase the amount of power provided to the terminal 219 from a first level (e.g., the amount of power provided to the terminal 219 by the power source 215 and the power source 205) to a second level (e.g., the first level plus a voltage level produced by the power source 205). As another example, the power source 305 can increase the amount of power provided to the terminal 223 from a first level (e.g., the amount of power provided to the terminal 223 by the power source 215) to a second level (e.g., the first level plus a voltage level produced by the power source 305).

Figure 4:
FIG. 4 is a schematic block diagram of the system illustrated in FIG. 1, according to some embodiments.
Figure 4:
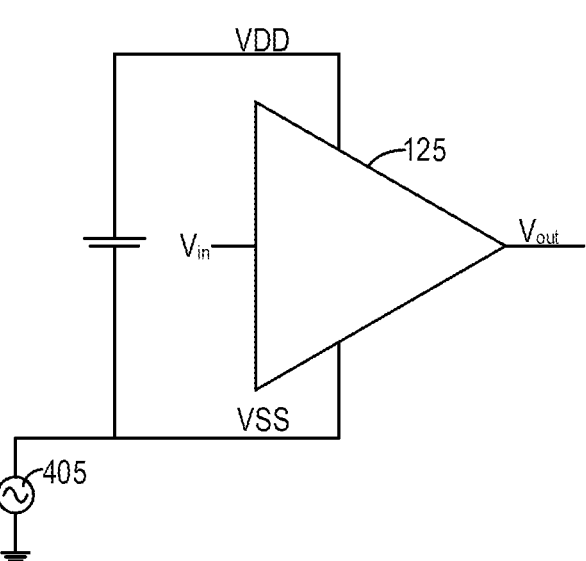

FIG. 4 depicts a schematic diagram 400 including elements of the system 100, according to some embodiments. The schematic diagram 400 may illustrate and/or otherwise represent an equivalent circuit with respect to at least one of the schematic diagram 200 and/or the schematic diagram 300. The schematic diagram 400 includes a power source 405. The power source 405 may include a bracketing power supply that represents a collection of and/or that models the behavior of at least one of the power source 205, the power source 215, and/or the power source 305. The schematic diagram 400 illustrates that any current that returns from Vout may be used to charge VSS. The charging of VSS may result in the return of energy and the return of energy may increase the efficiency of the driver 125. Additionally, the tighter the voltage bracket (e.g., the variance in the difference between VDD and VSS) can result in a higher VSS voltage level and the VSS voltage level being higher can further increase the amount of power returned to charge VSS.

Figure 5:
FIG. 5 is a schematic block diagram of the system illustrated in FIG. 1, according to some embodiments.
Figure 5:
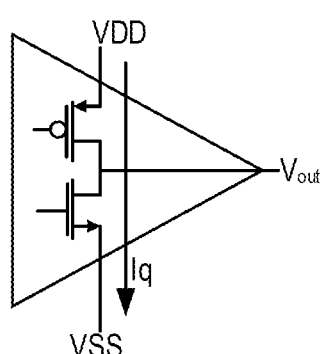

FIG. 5 depicts a schematic diagram 500 illustrating components of the driver 125, in some embodiments. FIG. 5 illustrates that current (e.g., Iq) is flowing from VDD via a first transistor to a second transistor and that the current is then flowing from the second transistor to VSS. The quiescent power of the driver 125 may be equal to the difference in voltage between VDD and VSS (e.g., the voltage bracket of the driver 125) and the current flowing from VDD to VSS (e.g., Iq). Additionally, the interference produced by the driver 125 that may impact the output signal (e.g., $V_{out}$) may be reduced as there is no voltage step between VDD and VSS (e.g., the difference between VDD and VSS is maintained).

Figure 6:
FIG. 6 is a schematic block diagram of components having varying states for use in voltage bracketing, according to some embodiments.
Figure 6:
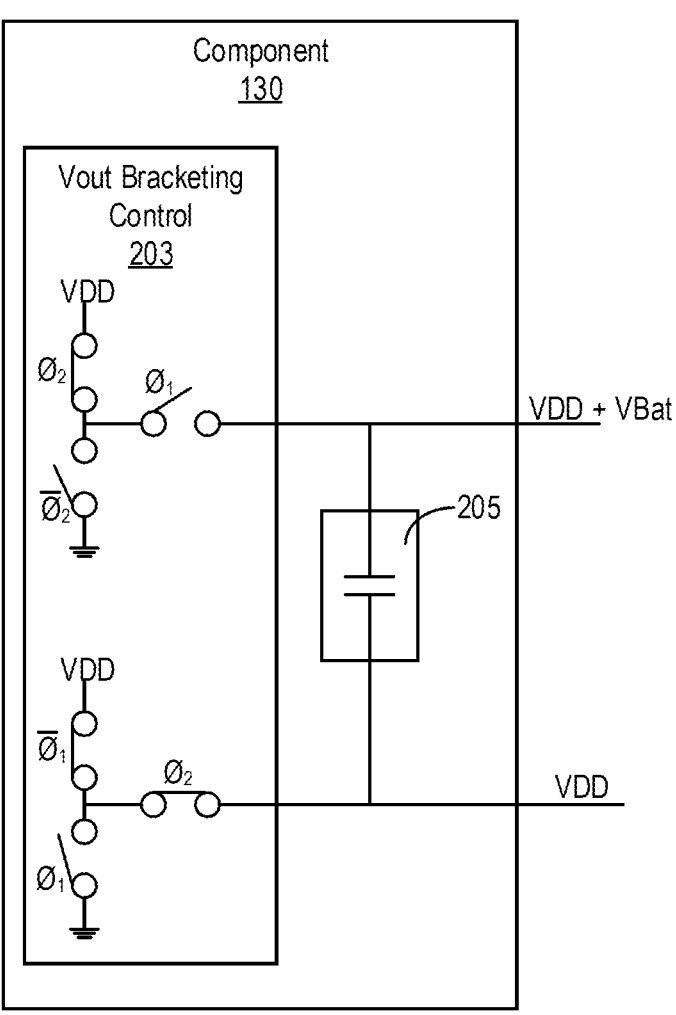

FIG. 6 depicts a schematic diagram 600 illustrating different configurations of the switches 207 and the switches 209, in some embodiments. As described herein, the Control Signals (e.g., $\varnothing_1$ and $\varnothing_2$) can control both the first set of components 130 (e.g., the switches 207) and the second set of components 130 (e.g., the switches 207). FIG. 6 depicts an example, with respect to the configurations of the switches 207 and the switches 209 as shown in FIG. 2, of the switches 207 having moved from the first configuration to the second configuration. As shown in FIG. 6, the power source 205 is shown to be electrically coupled with the supply line 217 and the power source 215 is shown to be electrically coupled with the supply line 221. FIG. 6 also illustrates that the voltage level of Terminal Supply 1 is $VDD+V_{bat}$ and that the voltage level of Terminal Supply 2 is VDD.

Figure 7:
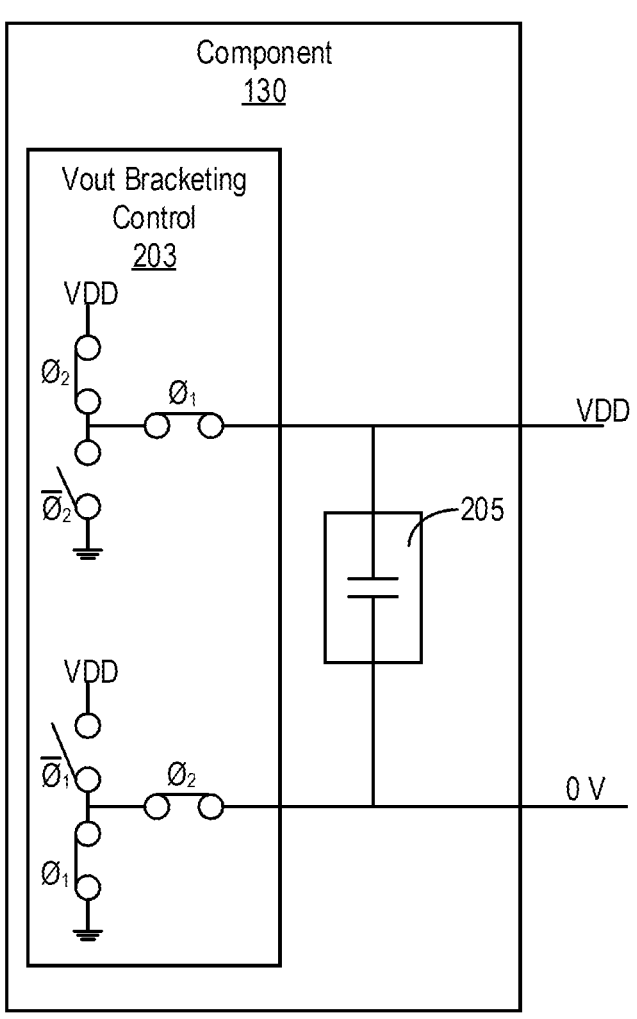
FIG. 7 is a schematic block diagram of the components illustrated in FIG. 6, according to some embodiments.

FIG. 7 depicts a schematic diagram 700 illustrating different configurations of the switches 207 and the switches 209, in some embodiments. FIG. 7 depicts an example, with respect to the configuration of the switches as shown in FIG. 6, of the switches 207 having moved from the second configuration back to the first configuration. As shown in FIG. 7, the power source 205 is electrically decoupled from the terminal 219 and the power source 215 is electrically decouple from the terminal 223. FIG. 7 illustrates that the voltage level of Terminal Supply 1 has changed from the second level (e.g., $VDD+V_{bat}$) to the first level (e.g., VDD). FIG. 7 also illustrates that the voltage level of Terminal Supply 2 has changed from a second level (e.g., VDD) to the first level (e.g., 0V).

Figure 8:
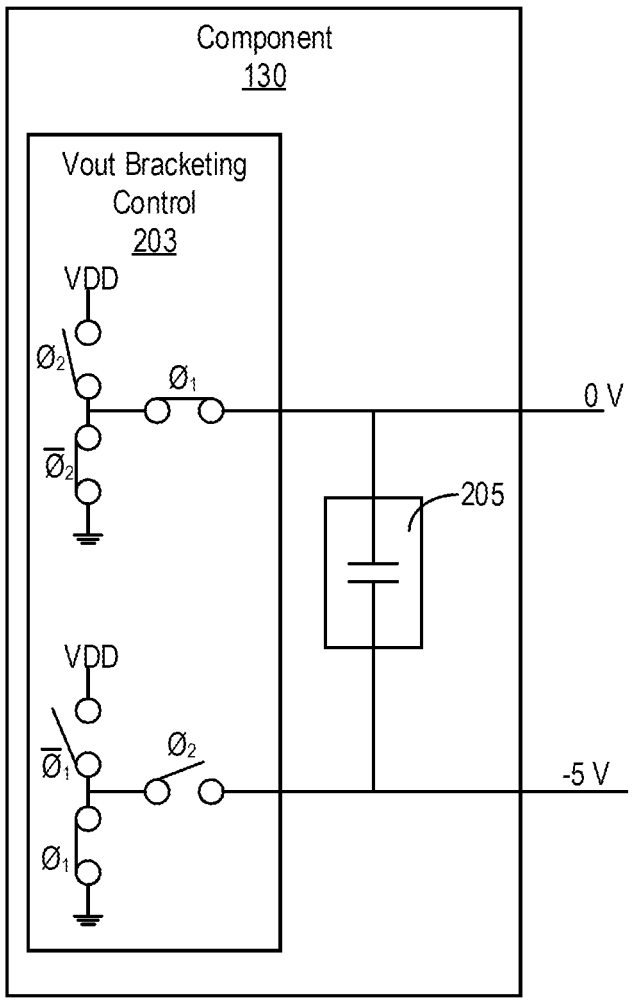
FIG. 8 is a schematic block diagram of the components illustrated in FIG. 6, according to some embodiments.

FIG. 8 depicts a schematic diagram 800 illustrating difference configurations of the switches 207 and the switches 209, in some embodiments. FIG. 8 depicts an example, with respect to the configuration of the switches as shown in FIG. 7, of the switches 209 having moved from a first configuration to a second configuration. As shown in FIG. 8, the power source 215 is electrically decoupled from the terminal 219. FIG. 8 also shows the power source 205 electrically coupled with the terminal 223. FIG. 8 illustrates that the voltage level of Terminal Supply 1 has changed from a first level (e.g., VDD) to a second level (e.g., 0V). FIG. 8 also illustrates that Terminal Supply 2 has changed from a first level (e.g., 0V) to a second level (e.g., −5V).

Figure 9:
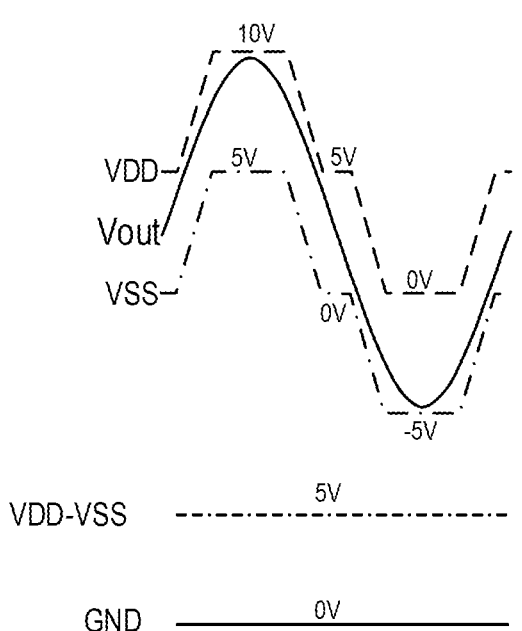
FIG. 9 is a graph illustrated signals provided to components of the system illustrated in FIG. 2, according to some embodiments.

FIG. 9 depicts a graph 900 illustrating signals as described herein, according to some embodiments. The graph 900 illustrates an example of changes in VDD, V$_{out}$ and VSS. The graph 900 also illustrates the voltage bracket of a driver. The graph 900 also illustrates a voltage level of ground. The example changes in VDD, Vout, and VSS may be produced, created, and/otherwise provided by the components illustrated in FIG. 2. In some embodiments, VDD may refer to and/or include the varying voltage levels of Terminal Supply 1. For example, VDD may refer to the amount of power that is provided to the terminal 219. In some embodiments, Vout may refer to and/or include the varying voltage levels of the first Output Supply Signal. For example, Vout may refer to the amount of power that is provided by the driver 125. In some embodiments, VSS may refer to and/or include the varying voltage levels of Terminal Supply 2. For example, VSS may refer to the amount of power that is provided to terminal 223.

As shown in FIG. 9 the voltage bracket (e.g., VDD-VSS) is shown to be maintained at 5V. The varying voltage levels of VDD and VSS can be produced and/or otherwise controlled by the signal processors 115. For example, the signals processors 115 can control the switches 207 and the switches 209. FIG. 9 depicts an example of the voltage levels for VDD and VSS changing with respect to Vout. For example, FIG. 9 illustrates that when Vout exceeds 5V that the voltage level for VDD is increased from 5V to 10V and that the voltage level of VSS is increased from 0V to 5V. FIG. 9 also illustrates that when Vout is less than 5V but larger than 0V that VDD is returned to 5V and VSS is returned to 0V. FIG. 9 also illustrates that when V$_{out}$ is less than 0V that VDD is decreased from 5V to 0V and that VSS is decreased from 0V to –5V.

Figure 10:
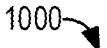
FIG. 10 is a graph illustrating signals provided to components of the system illustrated in FIG. 2, according to some embodiments.
Figure 10:
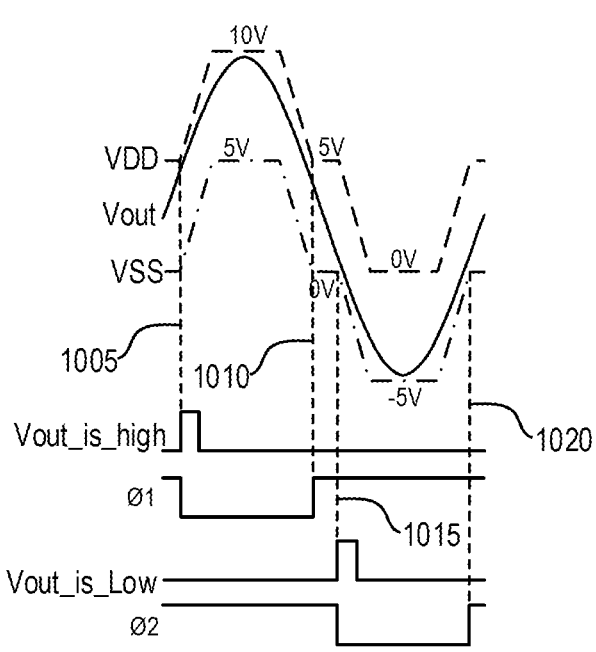

FIG. 10 depicts a graph 1000 illustrating signals provided to components of the system illustrated in FIG. 2, according to some embodiments. The graph 1000 depicts a change in voltage level for VDD and VSS with respect to the signals provided by the comparators 110 (e.g., Vout_is_High, Vout_is_Low) and with respect to the signals provided by the signal processors 115 (e.g., Ø$_1$ and Ø$_2$). FIG. 10 depicts that when Vout_is_high changes from a first level to a second level (e.g., V$_{out}$ is larger than a first Terminal Supply signal) that Ø$_1$ also changes from a first level to a second level. The changes to Vout_is_High and Ø$_1$ are shown, at vertical dashed line 1005, to cause the voltage level of VDD to increase from 5V to 10V and the voltage level of VSS to increase from 0V to 5V.

FIG. 10 also depicts that when Vout_is_High changes from the second level to the first level (e.g., the first level of the first Terminal Supply signal is larger than Vout) that Ø$_1$ also changes from the second level to the first level. The changes to Vout_is_High and Ø$_1$ are shown, at vertical dashed line 1010, to cause the voltage level of VDD to decrease from 10V to 5V and the voltage level of VSS to decrease from 5V to 0V.

FIG. 10 also depicts that when Vout_is_Low changes from the first level to the second level (e.g., a first level of the second Terminal Supply signal is larger than Vout) that Ø$_2$ also changes from a first level to a second level. The changes to Vout_is_Low and Ø$_2$ are shown, at vertical dashed line 1015, to cause the voltage level of VDD to decrease from 5V to 0V and the voltage level of VSS to decrease from 0V to –5V.

FIG. 10 also depicts that when Vout_is_Low changes from the second level to the first level (e.g., Vout is larger than the first level of the second Terminal Supply signal) that Ø$_2$ also changes from the second level to the first level. The changes to Vout_is_Low and Ø$_2$ are shown, at vertical dashed line 1020, to cause the voltage level of VDD to increase from 0V to 5V and the voltage level of VSS to increase from –5V to 0V. The varying voltage levels for the terminals of the driver 125 (e.g., the terminal 219 and the terminal 223) as shown in FIG. 10 may be referred to and/or include a bi-polar voltage range (e.g., the voltage levels include positive and negative levels).

Figure 11:
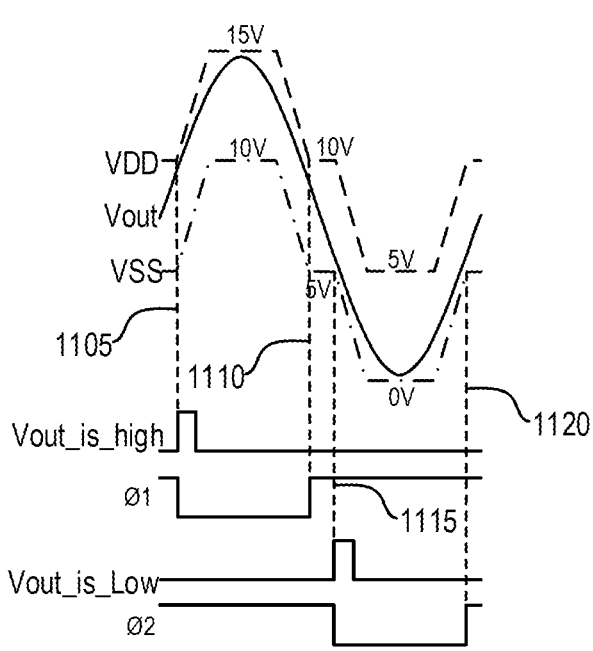
FIG. 11 is a graph illustrating signals provided to components of the system illustrated in FIG. 3, according to some embodiments.

FIG. 11 depicts a graph 1000 illustrating signals provided to components of the system illustrated in FIG. 3, according to some embodiments. The graph 1100 depicts a change in voltage level for VDD and VSS with respect to the signals provided by the comparators 110 (e.g., Vout_is_High, Vout_is_Low) and with respect to the signals provided by the signal processors (e.g., Ø$_1$ and Ø$_2$). FIG. 11 depicts that when Vout_is_high changes from a first level to a second level (e.g., Vout is larger than a first level of the first Terminal Supply signal) that Ø$_1$ also changes from a first level to a second level. The changes to Vout_is_High and Ø$_1$ are shown, at vertical dashed line 1105, to cause the voltage level of VDD to increase from 10V to 15V and the voltage level of VSS to increase from 5V to 10V.

FIG. 11 also depicts that when Vout_is_High changes from the second level to the first level (e.g., the first level of the first Terminal Supply signal is larger than Vout) that Ø$_1$ also changes from the second level to the first level. The changes to Vout_is_High and Ø$_1$ are shown, at vertical dashed line 1110, to cause the voltage level of VDD to decrease from 15V to 10V and the voltage level of VSS to decrease from 10V to 5V.

FIG. 11 also depicts that when Vout_is_Low changes from the first level to the second level (e.g., a first level of the second Terminal Supply signal is larger than Vout) that Ø$_2$ also changes from a first level to a second level. The changes to Vout_is_Low and Ø$_2$ are shown, at vertical dashed line 1115, to cause the voltage level of VDD to decrease from 10V to 5V and the voltage level of VSS to decrease from 5V to 0V.

FIG. 11 also depicts that when Vout_is_Low changes from the second level to the first level (e.g., V$_{out}$ is larger than the first level of the second Terminal Supply signal) that Ø$_2$ also changes from the second level to the first level. The changes to Vout_is_Low and Ø$_2$ are shown, at vertical dashed line 1120, to cause the voltage level of VDD to increase from 5V to 10V and the voltage level of VSS to increase from 0V to 5V. The varying voltage levels for the terminals of the driver 125 (e.g., the terminal 219 and the terminal 223) as shown in FIG. 11 may be referred to and/or include a single polar voltage range (e.g., the voltage levels remain greater than and/or include to 0V).

Figure 12:
FIG. 12 is a block diagram of a process of maintaining a voltage bracket, according to some embodiments.
Figure 12:
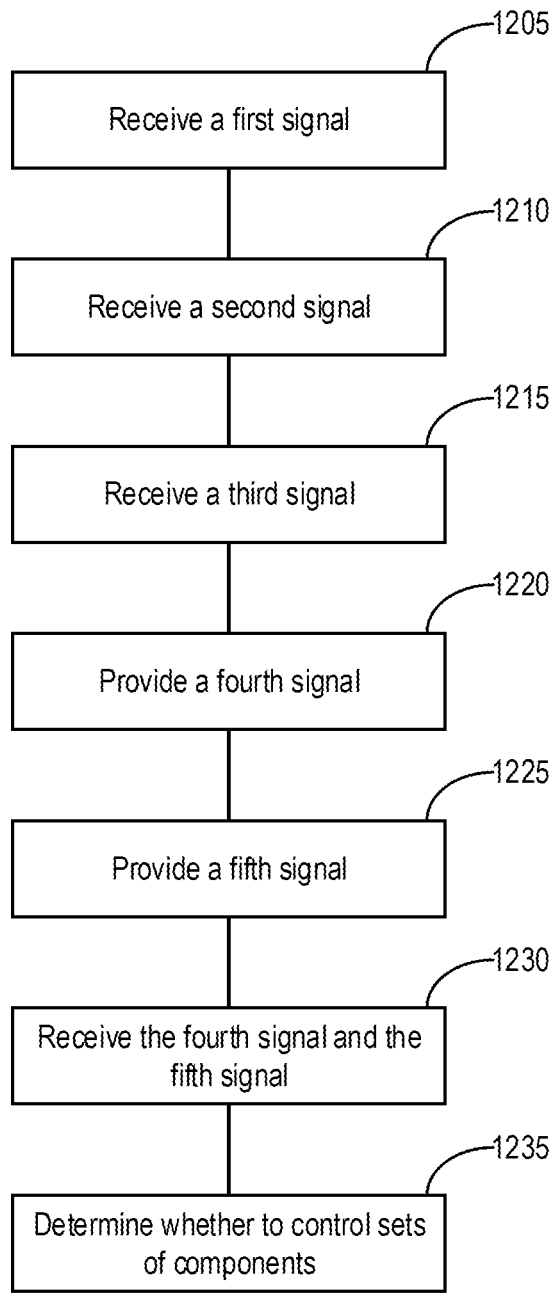

FIG. 12 depicts a block diagram of a process 1200 of maintaining a voltage bracketing, according to some embodiments. In some embodiments, at least one step of the process 1200 can be performed by the system 100 and/or a component thereof. For example, the comparators 110 can perform at least one step of the process 1200. In some embodiments, at least one step of the process 1200 can be performed by a component of the schematic diagram 200 and/or the schematic diagram 300. For example, the first Opamp 210 and/or the second Opamp 210 can perform at least one step of the process 1200.

At step 1205, a first signal may be received, in some embodiments. For example, the first signal may be received by the comparators 110. The first signal may be the first Terminal Supply signal described herein. The first signal may indicate an amount of power provided to a first terminal of a driver. For example, the first signal may indicate a voltage level of Terminal Supply 1 that is provided to the terminal 219. In some embodiments, the first signal may be received by the first Opamp 210.

At step 1210, a second signal may be received, in some embodiments. For example, the second signal may be received by the comparators 110. The second signal may be the second Terminal Supply signal. The second signal may indicate an amount of power provided to a second terminal of the driver. For example, the second signal may indicate a voltage level of Terminal Supply 2 that is provided to the terminal 223. In some embodiments, the second signal may be received by the second Opamp 210.

At step 1215, a third signal may be received, in some embodiments. For example, the third signal may be received by the comparators 110. The third signal may be the first Output Supply signal described herein. The third signal may indicate an amount of power provided by a driver. For example, the third signal may include a voltage level (e.g., Vout) that is provided by the driver 125. In some embodiments, the third signal may be received by at least one of the first Opamp 210 and/or the second Opamp 210.

At step 1220, a fourth signal may be provided, in some embodiments. For example, the fourth signal may be provided by the comparators 110. The fourth signal may be the first Comparison Signal described herein. The fourth signal may indicate a difference between the first signal, received in step 1205, and the third signal that was received in step 1215. For example, the fourth signal can be a comparison of the first signal and the third signal. The fourth signal may have a first level in response to the first signal being larger than the third signal. The fourth signal may have a second level in response to the third signal being larger than the first signal. For example, the comparators 110 can compare a voltage level of the first signal with a voltage level of the third signal. The fourth signal may have the first level in response to the voltage level of the first signal being larger than the voltage level of the third signal. The fourth signal may have the second level in response to the voltage level of the third signal being larger than the voltage level of the first signal.

At step 1225, a fifth signal may be provided, in some embodiments. For example, the fifth signal may be provided by the comparators 110. The fifth signal may be the second Comparison Signal described herein. The fifth signal may indicate a difference between the second signal, received in step 1210, and the third signal that was received in step 1215. For example, the fifth signal can be a comparison of the second signal and the third signal. The fifth signal may have a first level in response to the second signal being larger than the third signal. The fifth signal may have a second level in response to the third signal being larger than the second signal. For example, the comparators 110 can compare a voltage level of the second signal with a voltage level of the third signal. The fifth signal may have the first level in response to the voltage level of the second signal being larger than the voltage level of the third signal. The fifth signal may have the second level in response to the voltage level of the third signal being larger than the voltage level of the second signal.

At step 1230, the fourth signal and the fifth signal may be received, in some embodiments. For example, the signal processors 115 may receive the fourth signal and the fifth signal. In some embodiments, the signal processors 115 may receive the fourth signal from the first Opamps 210. In some embodiments, the signal processors 115 may receive the fifth signal from the second Opamps 210.

At step 1235, a determination to control sets of components may occur, in some embodiments. For example, the signal processors 115 may determine to control the first set of components 130. The signal processors 115 may also determine to control the second set of components 130. The signal processors 115 may determine based on the signals received in step 1230 (e.g., the fourth signal and the fifth signal) whether to control the first set of components to maintain the difference between the amount of power provided to the first terminal of the driver and the amount of power provided to the second terminal of the driver, in some embodiments.

The signal processors 115 may determine based on the signals received in step 1230 (e.g., the fourth signal and the fifth signal) whether to control the second set of components to maintain the difference between the amount of power provided to the first terminal of the driver and the amount of power provided to the second terminal of the driver. The difference between the amount of power provided to the first terminal of the driver and the amount of power provided to the second terminal of the driver may be and/or include a voltage bracket.

In some embodiments, the signal processors 115 may determine to control the first set of components 130 in response to the third signal being larger than the first signal. For example, the signal processors 115 may determine to control the first set of components 130 to increase a voltage level of Terminal Supply 1. In some embodiments, the signal processors 115 may determine to control the second set of components 130 in response to the second signal being larger than the third signal. For example, the signal processors 115 may determine to control the second set of components to decrease a voltage level of Terminal Supply 2.

In some embodiments, a sixth signal and a seventh signal may be provided. The sixth signal and the second signal may be provided by the signal processors 115. In some embodiments, the sixth signal may be the first Control Signal. In some embodiments, the sixth signal may be $\varnothing_1$. In some embodiments, the seventh signal may be the second Control Signal. In some embodiments, the seventh signal may be $\varnothing_2$. The sixth signal and the seventh signal may indicate control of the first set of components or the second set of components. For example, the first Control Signal may have a first level and the first level may indicate that the switches 207 will change from a first configuration to a second configuration. In some embodiments, the sixth signal and the seventh signal may result in a voltage level of the amount of power provided to the first terminal of the driver changing. In some embodiments, the sixth signal and the seventh signal may result in a voltage level of the amount of power provided to the second terminal of the driver changing. For example, the sixth signal and the seventh signal may cause the power source 205 to be electrically decoupled from the terminal 219. The sixth signal and the seventh signal may also cause the power source 215 to be electrically coupled with the terminal 219.

The hardware systems described herein may be implemented in many different ways and in many different combinations of hardware and software and circuit designs. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLO), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples. In some embodiments, the circuitry can be provided on one or more integrated circuit dies in an integrated circuit package. The integrated circuit package can be a combination of two or more packages in some embodiments.

The circuitry may further include or access instructions (e.g., software or firmware) for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HOD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic. The term "electrically decoupled" and variations thereof includes the disjoining (e.g., temporarily or permanently) of two members directly or indirectly to one another in some embodiments. Coupling and decoupling can be performed using a switch (e.g., a transistor).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a standalone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A system, comprising:
   a device comprising:
      a first circuit configured to:
         receive a first signal to indicate a first amount of power provided to a first terminal of a driver;
         receive a second signal to indicate a second amount of power provided to a second terminal of the driver;
         receive a third signal to indicate a third amount of power provided by the driver;
         provide a fourth signal having a first level in response to a level of the first signal being larger than a level of the third signal and the fourth signal having a second level in response to the level of the third signal being larger than the level of the first signal; and

provide a fifth signal having a first level in response to a level of the second signal being larger than the level of the third signal and the fifth signal having a second level in response to the level of the third signal being larger than the level of the second signal; and a second circuit configured to:
receive the fourth signal and the fifth signal; and
determine, based on the fourth signal and the fifth signal, whether to control:
a first set of components to maintain a difference between the first amount of power and the second amount of power; or
a second set of components to maintain the difference between the first amount of power and the second amount of power.

2. The system of claim 1, wherein the level of the first signal includes a first level, wherein the level of the second signal includes a first level, further comprising:
a power source configured to:
electrically couple with the first circuit;
adjust the first signal from the first level to a second level; and
produce, responsive to adjusting the first signal from the first level to the second level, a first threshold between the first signal and the third signal; and
a second power source configured to:
electrically couple with the first circuit;
adjust the second signal from the first level to a second level; and
produce, responsive to adjusting the second signal from the first level to the second level, a second threshold between the second signal and the third signal.

3. The system of claim 2, wherein:
the second circuit is configured to provide a sixth signal and a seventh signal to indicate control of the first set of components or the second set of components;
the first threshold is configured to result in the fourth signal having the second level prior to the level of the third signal exceeding the first level of the first signal; and
the second threshold is configured to result in the fifth signal having the first level prior to the first level of the second signal exceeding the level of the third signal.

4. The system of claim 1, further comprising:
the second circuit configured to provide a sixth signal and a seventh signal to indicate control of the first set of components or the second set of components; and
a power source configured to:
electrically couple with the first terminal of the driver; and
provide a first level of the first amount of power;
wherein the first set of components, in response to the sixth signal having a first level, are configured to:
electrically couple the power source with the second terminal of the driver to adjust, from a first level to a second level, the second amount of power; and
electrically couple a second power source with the first terminal of the driver to adjust, from the first level to a second level, the first amount of power; and
wherein the first set of components, in response to the sixth signal having a second level, are configured to:
electrically decouple the power source from the second terminal of the driver; and
electrically decouple the second power source from the first terminal of the driver.

5. The system of claim 4, wherein:
the second level of the first amount of power is configured to exceed, in response to the fourth signal having the second level, a level of the third amount of power; and
the second level of the second amount of power is configured to maintain the difference between the first amount of power and the second amount of power.

6. The system of claim 4, wherein:
a difference between the first level of the first amount of power and the first level of the second amount of power has a first value;
a difference between the second level of the first amount of power and the second level of the second amount of power has a second value; and
the first value and the second value are the same.

7. The system of claim 1, wherein:
the second circuit is configured to provide a sixth signal and a seventh signal to indicate control of the first set of components or the second set of components;
the second set of components, in response to the seventh signal having a first level, are configured to:
electrically decouple a power source from the first terminal of the driver; and
electrically couple a second power source with the second terminal of the driver; and
the second set of components, in response to the seventh signal having a second level, are configured to:
electrically decouple the second power source from the second terminal of the driver; and
electrically couple the power source with the first terminal of the driver.

8. The system of claim 7, wherein:
the power source is configured to provide, in response to the power source being electrically coupled with the first terminal of the driver, a first level of the first amount of power;
the first level of the first amount of power is configured to exceed, in response to the fourth signal having the first level, a first level of the third amount of power;
the second power source is configured to provide, in response to the second power source being electrically coupled with the second terminal of the driver, a first level of the second amount of power; and
the first level of the second amount of power is configured to exceed, in response to the fifth signal having the first level, a second level of the third amount of power.

9. The system of claim 8, wherein:
the first level of the first amount of power has a first amplitude and a first polarity;
the first level of the second amount of power has a second amplitude and a second polarity;
the first amplitude and the second amplitude are the same; and
the first polarity and the second polarity are different.

10. The system of claim 1, further comprising:
a power source configured to:
adjust, from a first level to a second level, the first amount of power; and
produce, responsive to adjusting the first amount of power, a difference between the first amount of power and the third amount of power;
wherein the difference between the first amount of power and the third amount of power is produced in response to the fourth signal having the second level.

11. The system of claim 10, wherein the power source is configured to:

adjust, from a first level to a second level, the second amount of power; and produce, responsive to adjusting the second amount of power, a difference between the second amount of power and the third amount of power;

wherein the difference between the second amount of power and the third amount of power is produced in response to the fifth signal having the first level.

12. A device, comprising:

a first circuit configured to:

receive a first signal to indicate a first amount of power provided to a first terminal of a driver;

receive a second signal to indicate a second amount of power provided to a second terminal of the driver;

receive a third signal to indicate a third amount of power provided by the driver;

provide a fourth signal having a first level in response to a level of the first signal being larger than a level of the third signal and the fourth signal having a second level in response to the level of the third signal being larger than the level of the first signal; and provide a fifth signal having a first level in response to a level of the second signal being larger than the level of the third signal and the fifth signal having a second level in response to the level of the third signal being larger than the level of the second signal; and a second circuit configured to:

receive the fourth signal and the fifth signal; and determine, based on the fourth signal and the fifth signal, whether to control:

a first set of components to maintain a difference between the first amount of power and the second amount of power; or a second set of components to maintain the difference between the first amount of power and the second amount of power.

13. The device of claim 12, wherein the level of the first signal includes a first level, wherein the level of the second signal includes a first level, further comprising:

a power source configured to:

electrically couple with the first circuit;

adjust the first signal from the first level to a second level; and produce, responsive to adjusting the first signal from the first level to the second level, a first threshold between the first signal and the third signal; and a second power source configured to:

electrically couple with the first circuit;

adjust the second signal from the first level to a second level; and produce, responsive to adjusting the second signal from the first level to the second level, a second threshold between the second signal and the third signal.

14. The device of claim 13, wherein:

the second circuit is configured to provide a sixth signal and a seventh signal to indicate control of the first set of components or the second set of components;

the first threshold is configured to result in the fourth signal having the second level prior to the level of the third signal exceeding the first level of the first signal; and the second threshold is configured to result in the fifth signal having the first level prior to the first level of the second signal exceeding the level of the third signal.

15. The device of claim 12, further comprising:

the second circuit configured to provide a sixth signal and a seventh signal to indicate control of the first set of components or the second set of components; and a power source configured to:

electrically couple with the first terminal of the driver; and provide a first level of the first amount of power;

wherein the first set of components, in response to the sixth signal having a first level, are configured to:

electrically couple the power source with the second terminal of the driver to adjust, from a first level to a second level, the second amount of power; and electrically couple a second power source with the first terminal of the driver to adjust, from the first level to a second level, the first amount of power; and wherein the first set of components, in response to the sixth signal having a second level, are configured to:

electrically decouple the power source from the second terminal of the driver; and electrically decouple the second power source from the first terminal of the driver.

16. The device of claim 15, wherein the second level of the first amount of power is configured to exceed, in response to the fourth signal having the second level, a level of the third amount of power; and the second level of the second amount of power is configured to maintain the difference between the first amount of power and the second amount of power.

17. The device of claim 15, wherein:

a difference between the first level of the first amount of power and the first level of the second amount of power has a first value;

a difference between the second level of the first amount of power and the second level of the second amount of power has a second value; and the first value and the second value are the same.

18. The device of claim 12, wherein:

the second circuit is configured to provide a sixth signal and a seventh signal to indicate control of the first set of components or the second set of components;

the second set of components, in response to the seventh signal having a first level, are configured to:

electrically decouple a power source from the first terminal of the driver; and electrically couple a second power source with the second terminal of the driver; and the second set of components, in response to the seventh signal having a second level, are configured to:

electrically decouple the second power source from the second terminal of the driver; and electrically couple the power source with the first terminal of the driver.

19. The device of claim 18, wherein:

the power source is configured to provide, in response to the power source being electrically coupled with the first terminal of the driver, a first level of the first amount of power;

the first level of the first amount of power is configured to exceed, in response to the fourth signal having the first level, a first level of the third amount of power;

the second power source is configured to provide, in response to the second power source being electrically coupled with the second terminal of the driver, a first level of the second amount of power; and the first level of the second amount of power is configured to exceed, in response to the fifth signal having the first level, a second level of the third amount of power.

20. A method for maintaining a difference between an amount of power provided to a first terminal of a driver and an amount of power provided to a second terminal of the driver, the method comprising:

receiving, by a first circuit, a first signal to indicate the amount of power provided to the first terminal of the driver;

receiving, by the first circuit, a second signal to indicate the amount of power provided to the second terminal of the driver;

receiving, by the first circuit, a third signal to indicate a third amount of power provided by the driver;

providing, by the first circuit, a fourth signal having a first level in response to the first signal being larger than the third signal and the fourth signal having a second level in response to the third signal being larger than the first signal;

providing, by the first circuit, a fifth signal having a first level in response to the second signal being larger than the third signal and the fifth signal having a second level in response to the third signal being larger than the second signal;

receiving, by a second circuit, the fourth signal and the fifth signal; and determining, by the second circuit based on the fourth signal and the fifth signal, whether to control:

a first set of components to maintain the difference between the amount of power provided to the first terminal of the driver and the amount of power provided to the second terminal of the driver; or a second set of components to maintain the difference between the amount of power provided to the first terminal of the driver and the amount of power provided to the second terminal of the driver.

* * * * *